United States Patent [19]

Takemae et al.

[11] Patent Number: 4,744,061
[45] Date of Patent: May 10, 1988

[54] DYNAMIC SEMICONDUCTOR MEMORY DEVICE HAVING A SIMULTANEOUS TEST FUNCTION FOR DIVIDED MEMORY CELL BLOCKS

[75] Inventors: Yoshihiro Takemae; Kimiaki Sato, both of Tokyo; Masao Nakano; Tomio Nakano, both of Kawasaki, all of Japan

[73] Assignee: Fujitsu Limited, Kawasaki, Japan

[21] Appl. No.: 673,510

[22] Filed: Nov. 20, 1984

[30] Foreign Application Priority Data

Nov. 25, 1983 [JP] Japan .................. 58-220553

[51] Int. Cl.$^4$ .................................... G11C 29/00
[52] U.S. Cl. .................................... 365/201; 365/230
[58] Field of Search .................. 365/189, 230, 201

[56] References Cited

U.S. PATENT DOCUMENTS 4,464,750 8/1984 Tatematsu ................. 365/201
4,541,090 9/1985 Shiragasawa ............. 365/201

FOREIGN PATENT DOCUMENTS 0055129 6/1982 European Pat. Off. .

OTHER PUBLICATIONS

Patent Abstracts of Japan, vol. 7, No. 253, Nov. 10, 1983 & JP-A-58 13 7178.
Patent Abstracts of Japan, vol. 7, No. 23, Jan. 29, 1983 & JP-A14 57 176 587.
Patent Abstracts of Japan, vol. 5, No. 107, Jul. 11, 1981 & JP-A14 56 51 093.

*Primary Examiner*—James W. Moffitt
*Attorney, Agent, or Firm*—Staas & Halsey

[57] ABSTRACT

A dynamic semiconductor memory device including memory cells divided into a plurality of blocks (1-1, 1-2). A simultaneous write enable circuit performs a write operation simultaneously upon the plurality of blocks, and a comparison circuit compares read data of one block with read data of the other block, thereby carrying out a test.

8 Claims, 7 Drawing Sheets

| $D_1$ | $\overline{D_1}$ | $D_2$ | $\overline{D_2}$ | $TP2'$ | $TP3'$ |
|---|---|---|---|---|---|
| H | L | H | L | L | H |
| L | H | H | L | H | H |
| H | L | L | H | H | H |
| L | H | L | H | H | L |

DYNAMIC SEMICONDUCTOR MEMORY DEVICE HAVING A SIMULTANEOUS TEST FUNCTION FOR DIVIDED MEMORY CELL BLOCKS

BACKGROUND OF THE INVENTION (1) Field of the Invention

The present invention relates to a semiconductor memory device having memory cells divided into a plurality of separated blocks, and more particularly, to a semiconductor memory device having a test circuit enabling a simultaneous test for the plurality of blocks.

(2) Description of the Related Art

In recent years, dynamic metal-oxide semiconductor (MOS) random access memories (RAM's) have been enlarged to 1 Mbit. However, as the integration density of devices has increased, the test time period for such devices has also increased. Particularly, in a RAM having a small number of output bits, the test time period thereof is remarkably increased.

On the other hand, as the integration density has become higher, the number of memory cells connected to one sense amplifier for the read operation has become higher and, accordingly, the load of each sense amplifier has also become higher so as to reduce the speed of the read operation. In order to reduce the load of each sense amplifier, two or more series of sense amplifiers are provided. That is, the memory cells, sense amplifiers, row address decoders, and the like are divided into two or more blocks.

SUMMARY OF THE INVENTION

It is an object of the present invention to provide a dynamic RAM having a remarkably reduced test time period.

According to the present invention, in a semiconductor memory device having memory cells divided into a plurality of blocks, a means for writing data in parallel into the plurality of blocks and a means for comparing data read out of the plurality of blocks, are provided. As a result, it is possible to test a number of memory call bits in parallel, which is larger than the number of bits in use during a normal operation mode, and accordingly, it is possible to reduce the test time period therefor.

BRIEF DESCRIPTION OF THE DRAWINGS

The present invention is more clearly understood from the description as set forth below with reference to the drawings, wherein.

DESCRIPTION OF THE PREFERRED EMBODIMENTS

Figure 1:
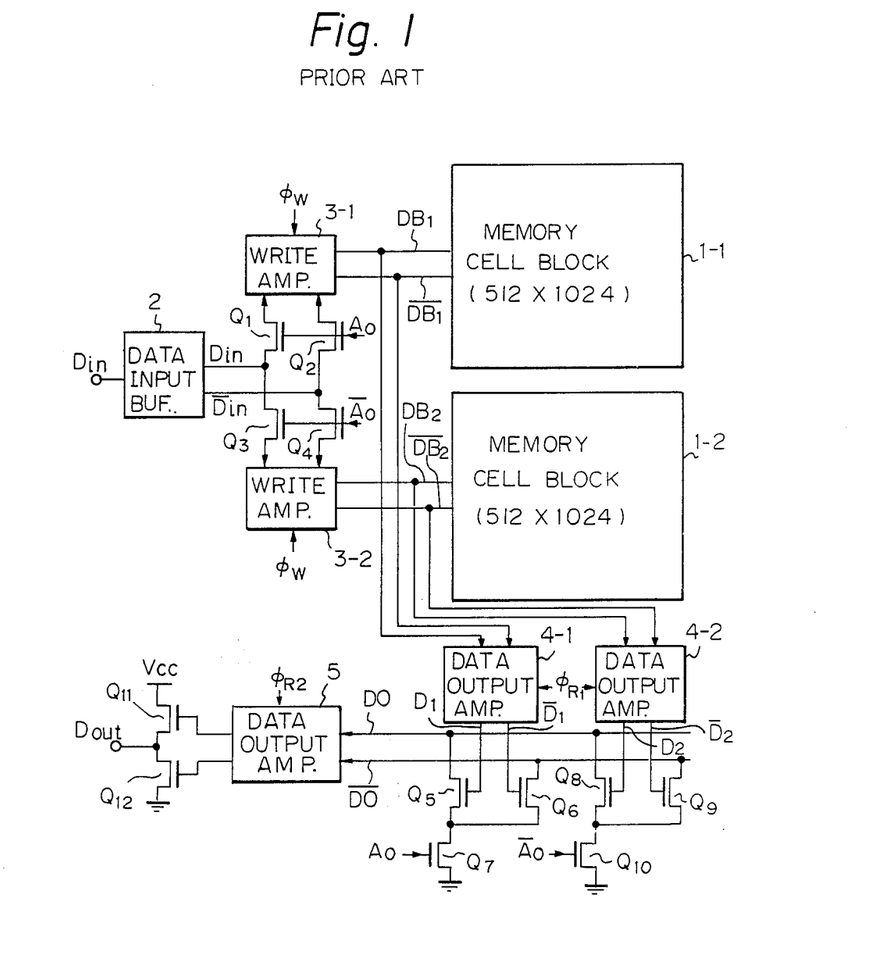
FIG. 1 is a circuit diagram of a prior art dynamic RAM.

In FIG. 1, which illustrates a prior art dynamic RAM, 1 Mbit memory cells are divided into two 512 kbit memory cell blocks 1-1 and 1-2. In order to perform a write operation upon a memory cell of the memory cell blocks 1-1 and 1-2, a data input buffer 2, write amplifiers 3-1 and 3-2 clocked by a clock signal $\phi_W$, and transistors $Q_1$ through $Q_4$ are provided. The data input buffer 2 receives an input data signal $D_{in}$ of a transistor-transistor logic (TTL) level, and, as a result, generates an input data signal $D_{in}$ of a metal-oxide semiconductor (MOS) level and its inverted signal. The input data signals $D_{in}$ and $\overline{D}_{in}$ are supplied via the transistors $Q_1$ and $Q_2$ to the write amplifiers 3-1, and in addition, are supplied via the transistors $Q_3$ and $Q_4$ to the write amplifier 3-2. In this case, the transistors $Q_1$ and $Q_2$ are controlled by one bit of row address signals such as an upper bit A, while the transistors $Q_3$ and $Q_4$ are controlled by its inverted signal $\overline{A}_0$. For example, when the potential of the address signal $A_0$ is high, the data signals $D_{in}$ and $\overline{D}_{in}$ are transmitted via the transistors $Q_1$ and $Q_2$ to the write amplifier 3-1. One memory cell is then selected within the memory cell block 1-1 by the row and column address decoders, not shown, and a write operation of data from the write amplifier 3-1 is performed upon the selected memory cell by using data buses $DB_1$ and $\overline{DB}_1$. Contrary to this, when the potential of address signal $A_0$ is low, and accordingly, the potential of the address signal $\overline{AHD}\ 0$ is high, the data signals $D_{in}$ and $\overline{D}_{in}$ are transmitted via the transistors $Q_3$ and $Q_4$ to the write amplifier 3-2. One memory cell is then selected within the memory cell block 1-2 by the row and column address decoders, not shown, and a write operation of data from the write amplifier 3-2 is performed upon the selected memory cell by using data buses $DB_2$ and $\overline{DB}_2$.

Thus, a write operation is performed upon only one block, i.e., one of the memory cell blocks 1-1 and 1-2.

In order to perform a read operation upon a memory cell of the memory cell blocks 1-1 and 1-2, two data output amplifiers 4-1 and 4-2 clocked by a clock signal $\phi_{R1}$, transistors $Q_5$ through $Q_{12}$, and a data output buffer 5 clocked by a clock signal $\phi_{R2}$, are provided. The transistors $Q_5$, $Q_6$, and $Q_7$ serve as a selection circuit for selectively connecting the outputs $D_1$ and $\overline{D}_1$ of the data output amplifier 4-1 to data output buses DO and $\overline{DO}$, while the transistors $Q_8$, $Q_9$, and $Q_{10}$ serve as a selection circuit for selectively connecting the outputs $D_2$ and $\overline{D}_2$ of the data output amplifier 4-2 to the data output buses DO and $\overline{DO}$. The potentials of the data output buses DO and $\overline{DO}$ are transmitted via the data output buffer 5 to the transistors $Q_{11}$ and $Q_{12}$ which serve as a data output buffer.

The transistor $Q_7$ is controlled by the address signal $A_0$, while the transistor $Q_{10}$ is controlled by the address signal $\overline{A}_0$. Therefore, only one of the data output amplifiers 4-1 and 4-2 is selectively connected to the data output buses DO and $\overline{DO}$. For example, when the address signal $A_0$ is high, the transistor $Q_7$ is turned on, so that one of the transistors $Q_5$ and $Q_6$ is turned on and the other is turned off. As a result, the outputs $D_1$ and $\overline{D}_1$ are transmitted via the transistors $Q_5$ and $Q_6$ to the data output buses DO and $\overline{DO}$. Contrary to this, when the address signal $A_0$ is low, and accordingly, the address signal $\overline{A}_0$ is high, the transistor $Q_{10}$ is turned on, so that one of the transistors $Q_8$ and $Q_9$ is turned on and the other is turned off. As a result, the outputs $D_2$ and $\overline{D}_2$ are transmitted via the transistors $Q_8$ and $Q_9$ to the data output buses DO and $\overline{DO}$.

Thus, in the device of FIG. 1, during a write mode, input data $D_{in}$ is written into one memory cell of a memory cell block selected by the address signals $A_0$ and $\overline{A}_0$, and during a read mode, data is read out of one memory cell of a memory cell block selected by the address signals $A_0$ and $\overline{A}_0$. Therefore, in the testing of the device of FIG. 1, input data is sequentially written into each of the memory cells, and it is determined whether or not a writing and reading operation is normally carried out by comparing output data with the input data. As a result, the test time period becomes remarkably long, particularly in the case of a high-integrated capacity memory device.

Figure 2:
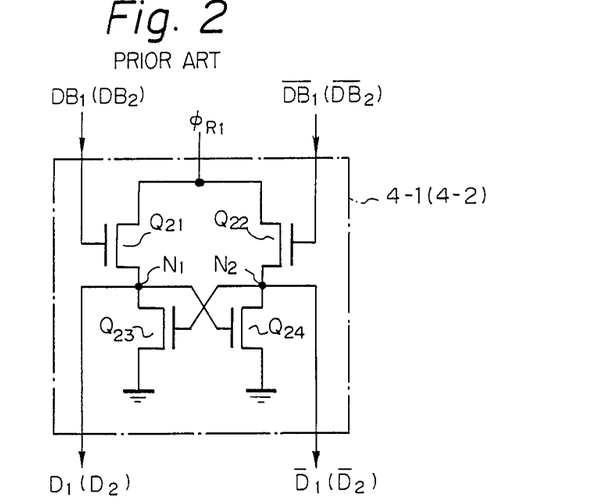
FIG. 2 is a circuit diagram of the prior art data output amplifier of FIG. 1.

Note that each of the data output amplifiers 4-1 and 4-2 is fully illustrated in FIG. 2. That is, each of the data output amplifiers 4-1 and 4-2 comprises two transistors $Q_{21}$ and $Q_{22}$ clocked by the clock signal $\phi_{R1}$ and controlled by the potentials at the data buses $DB_1$ and $\overline{DB}_1$ (or $DB_2$ and $\overline{DB}_2$), and further comprises two cross-coupled transistors $Q_{23}$ and $Q_{24}$ which form a flip-flop. The potentials at nodes $N_1$ and $N_2$ are transmitted as the outputs $D_1$ and $\overline{D}_1$ (or $D_2$ and $\overline{D}_2$) to the gates of the transistors $Q_5$ and $Q_6$ (or $Q_8$ and $Q_9$). Also, the data output buffer 5 has the same configuration as the circuit of FIG. 2.

Figure 3:
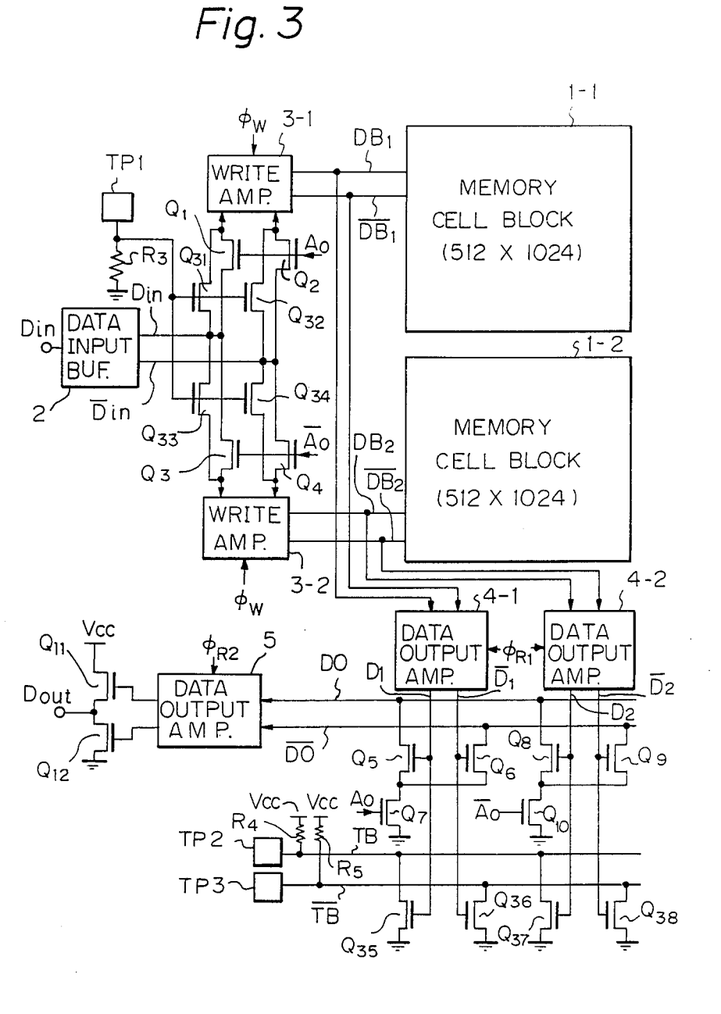
FIG. 3 is a circuit diagram of an embodiment of the dynamic RAM according to the present invention.

In FIG. 3, which illustrates an embodiment of the present invention, a test pad TP1, a pulling-down resistor $R_3$, and transistors $Q_{31}$, $Q_{32}$, $Q_{33}$, and $Q_{34}$ are added to the elements of the device of FIG. 1, thereby performing a write operation of the same input data $D_{in}$ upon both of the blocks, i.e., both of the memory cell blocks 1-1 and 1-2, simultaneously. That is, the elements TP1, $R_3$, $Q_{31}$, $Q_{32}$, $Q_{33}$, and $Q_{34}$ form a simultaneous write enable circuit for the memory cell blocks 1-1 and 1-2. In addition, transistors $Q_{35}$, $Q_{36}$, $Q_{37}$, and $Q_{38}$, pulling-up resistors $R_4$ and $R_5$, and test pads TP2 and TP3 are added to the elements of the device of FIG. 1, thereby comparing the outputs $D_1$ and $\overline{DHD}$ 1 of the data output amplifier 4-1 with the outputs $D_2$ and $\overline{D}_2$ of the data output amplifier 4-2. That is, the elements $Q_{35}$, $Q_{36}$, $Q_{37}$, $Q_{38}$, $R_4$, $R_5$, TP2, and TP3 form a comparison circuit for the outputs of the memory cell blocks 1-1 and 1-2.

During a normal operation mode, the potential at the test pad TP1 is in an open state, so that the charge at the test pad TP1 is discharged. As a result, all the transistors $Q_{31}$, $Q_{32}$, $Q_{33}$, and $Q_{34}$ are cut off. Therefore, the device of FIG. 3. operates in the same way as the device of FIG. 1. Of course, in this case, the output comparison circuit formed by the elements $Q_{35}$, $Q_{36}$, $Q_{37}$, $Q_{38}$, $R_4$, $R_5$, TP2, and TP3 does not affect the normal operation.

During a test operation mode, a high potential is applied to the test pad TP1, so that the transistors $Q_{31}$, $Q_{32}$, $Q_{33}$, and $Q_{34}$ are turned on. As a result, the input data $D_{in}$ is supplied to the write amplifiers 3-1 and 3-2, and accordingly, the input data $D_{in}$ is written into one memory cell of each memory cell block 1-1 and 1-2. The selection of this one memory cell is carried out by the row and column address decoders (not shown).

Note that the pulling-down resistor $R_3$ linked between the test pad TP1 and the ground is provided for pulling down the potential at the test pad TP1 to a low level when the test pad 1 is in an open state.

Figure 4:
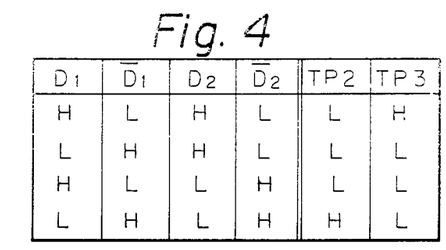
FIG. 4 is a table for the output of the output comparison circuit of FIG. 3.

Thus, after the same input data $D_{in}$ is written into the two memory blocks 1-1 and 1-2, data is read out of each of the memory cell blocks 1-1 and 1-2, and is stored in each of the data output amplifiers 4-1 and 4-2. The outputs $D_1$ and $\overline{D}_1$ of the data output amplifier 4-1 are applied to the gates of the transistors $Q_{35}$ and $Q_{36}$, while the outputs $D_2$ and $\overline{D}_2$ of the data output amplifier 4-2, are applied to the gates of the transistors $Q_{37}$ and $Q_{38}$. At this time, when the outputs $D_1$ and $\overline{D}_1$ are the same as the outputs $D_2$ and $\overline{D}_2$, respectively, signals having different polarities are generated at the test pads TP2 and TP3 via test buses TB and $\overline{TB}$. Referring to FIG. 4, if the outputs $D_1$ and $D_2$ are both at a high level (H) and the outputs $\overline{D}_1$ and $\overline{D}_2$ are both at a low level (L), the transistors $Q_{35}$ and $Q_{37}$ are turned on and the transistors $Q_{36}$ and $Q_{38}$ are cut off. As a result, the potentials at the test pads TP2 and TP3 are at a low level and at a high level, respectively. Similarly, if the outputs $D_1$ and $D_2$ are both at a low level, and the outputs $\overline{D}_1$ and $\overline{D}_2$ are both at a high level, the transistors $Q_{36}$ and $Q_{38}$ are turned on and the transistors $Q_{35}$ and $Q_{37}$ are cut off. As a result, the potentials at the test pads TP2 and TP3 are at a high level and at a low level, respectively.

Contrary to the above, if the outputs $D_1$ and $\overline{D}_1$ of the data output amplifier 4-1 are different from the outputs $D_2$ and $\overline{D}_2$ of the data output amplifier 4-2, the potentials at the test pads TP2 and TP3 are both at a low level, as shown in FIG. 4. For example, if the outputs $D_1$ and $\overline{D}_1$ are at a high level and at a low level, respectively, and the outputs $D_2$ and $\overline{D}_2$ are at a low level and at a high level, respectively, the transistors $Q_{35}$, and $Q_{38}$ are both turned on and the transistors $Q_{36}$ and $Q_{37}$ are cut off, and accordingly, the potentials at the test pads TP2 and TP3 are both at a low level.

Thus, the state wherein the potentials at the test pads TP2 and TP3 are both low exhibits an error state; i.e., one of the memory cell blocks 1-1 and 1-2 is erroneously operated.

Figure 5:
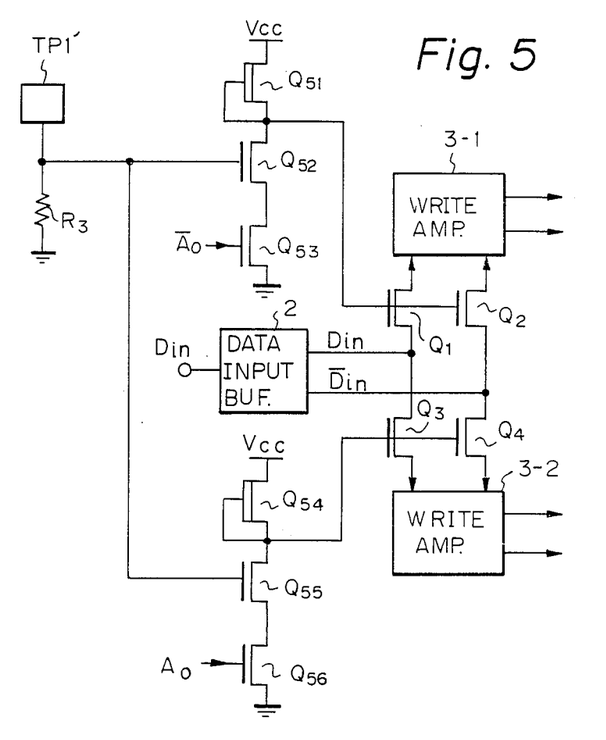
FIG. 5 is a circuit diagram of a modification of the simultaneous write enable circuit of FIG. 3.

In FIG. 5, which is a modification of the simultaneous write enable circuit of FIG. 3, the gate potentials of the transistors $Q_1$, $Q_2$, $Q_3$, and $Q_4$ are controlled, thereby switching the normal operation mode and the test operation mode. For this purpose, a depletion-type transistor $Q_{51}$, enhancement-type transistors $Q_{52}$ and $Q_{53}$, a depletion-type transistor $Q_{54}$, enhancement-type transistors $Q_{55}$ and $Q_{56}$, and a test pad TP1' are provided. In this case, the transistors $Q_{51}$, $Q_{52}$, and $Q_{53}$ form a NAND circuit, and the transistors $Q_{54}$, $Q_{55}$, $Q_{56}$ also form a NAND circuit.

During a normal operation mode, the potential at the test pad TP1' is high, so that the NAND circuit formed by the transistors $Q_{51}$, $Q_{52}$, and $Q_{53}$ serves as an inverter for the address signal $\overline{A}_0$, and the NAND circuit formed by the transistors $Q_{54}$, $Q_{55}$, and $Q_{56}$ also serves as inverter for the address signal $A_0$. Therefore, the circuit of FIG. 5 operates in the same way as the device of FIG. 1.

On the other hand, during a test operation mode, the test pad TP1' is in an open state, so that the charge of the test pad TP1' is discharged via the resistor $R_3$, thereby decreasing the potential at the test pad TP1'. As a result, the transistors $Q_{52}$ and $Q_{55}$ are both cut off, and the gate potentials of the transistors $Q_1$, $Q_2$, $Q_3$, and $Q_4$ remain high, by the depletion-type transistors $Q_{51}$ and $Q_{54}$. As a result, the input data $D_{in}$ is supplied to the write amplifiers 3-1 and 3-2, and accordingly, the input data $D_{in}$ is written into one memory cell of each memory cell block 1-1 and 1-2.

Figure 6:
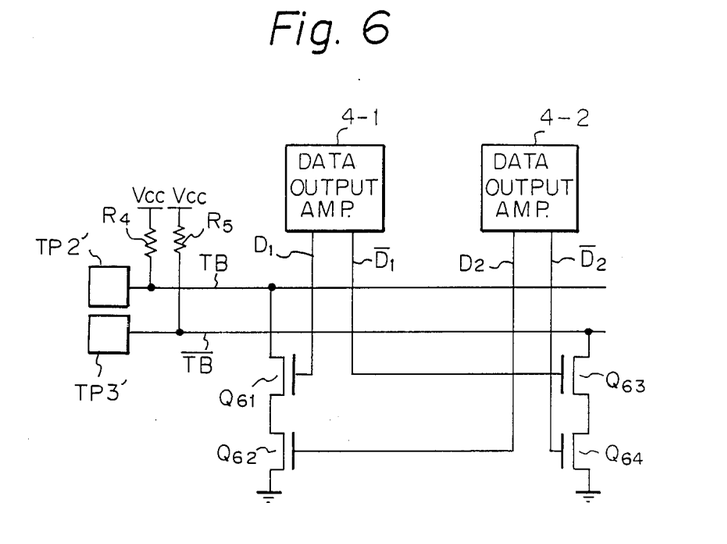
FIG. 6 is a circuit diagram of a modification of the output comparison circuit of FIG. 3.
Figure 7:
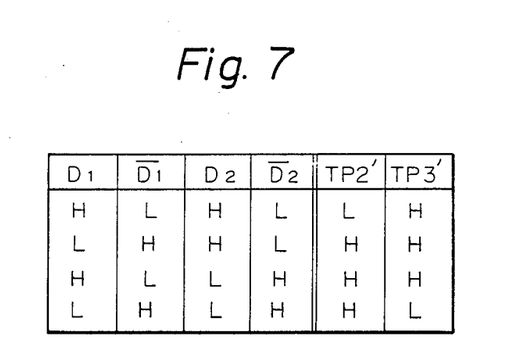
FIG. 7 is a table for the outputs of the output comparison circuit of FIG. 6.

In FIG. 6, which is modification of the output comparison circuit of FIG. 3, transistors $Q_{61}$ and $Q_{62}$ provided in series, and transistors $Q_{63}$ and $Q_{64}$ are also provided in series. The operation of the circuit of FIG. 6 is shown in a truth table of FIG. 7. This table shows that the state wherein the potentials at the test pads TP2' and TP3' are both high exhibits an error state; i.e., one of the memory cell blocks 1-1 and 1-2 is erroneously operated. Note that, if there are more than three data output amplifiers, i.e., more than three memory cell blocks, it is possible to carry out an output comparison thereupon by increasing the number of transistors connected in series.

Figure 8:
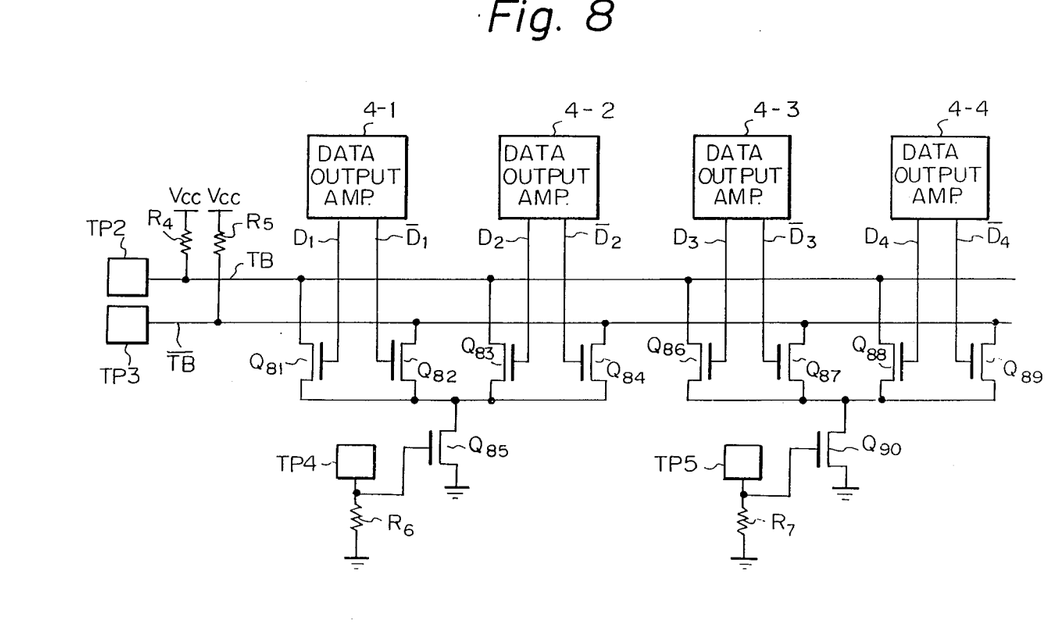
FIG. 8 is a circuit diagram of another modification of the output comparison circuit of FIG. 3.

In FIG. 8, which is another modification of the output comparison circuit of FIG. 3, transistors $Q_{81}$ through $Q_{90}$, test pads TP4 and TP5, and pulling-down resistors $R_6$ and $R_7$, are provided for four data output amplifiers 4-1 through 4-4. The transistors $Q_{81}$ through $Q_{84}$ correspond to the transistor $Q_{35}$ through $Q_{38}$ of FIG. 3, respectively, and the transistors $Q_{86}$ through $Q_{89}$ also correspond to the transistors $Q_{35}$ through $Q_{38}$ of FIG. 3, respectively. When a common test is required for all the data output amplifiers 4-1 through 4-4, a high potential is applied to both of the test pads TP4 and TP5. Contrary to this, when a partial test is required for the data output amplifiers 4-1 and 4-2, a high potential is applied to only the test pad TP4.

Figure 9:
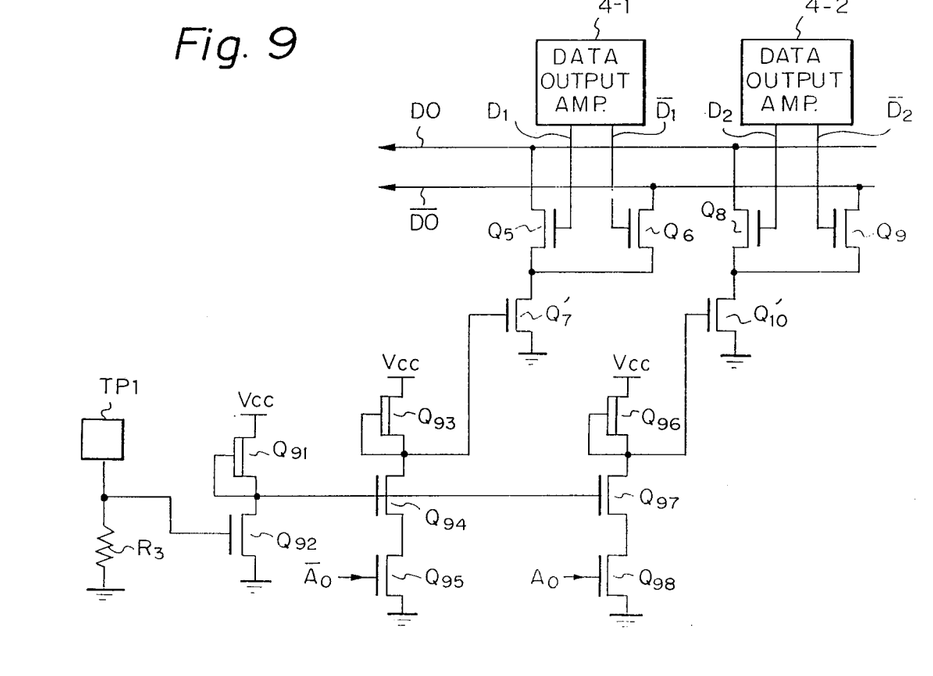
FIG. 9 is a circuit diagram of still another modification of the output comparison circuit of FIG. 3.

In FIG. 9, which is still another modification of the output comparison circuit of FIG. 3, the data output buses DO and $\overline{DO}$ also serve as test buses TB and $\overline{TB}$, and accordingly, the test pads TP2 and TP3 (or TP2' and TP3') are not provided. Therefore, the result of the output comparison circuit is obtained at the output of the output buffer formed by the transistors $Q_{11}$ and $Q_{12}$ of FIG. 3. In FIG. 9, transistors $Q_7'$ and $Q_{10}'$, which correspond to the transistors $Q_7$ and $Q_{10}$, respectively, are provided. However, the gate potentials of the transistors $Q_7'$ and $Q_{10}'$ are controlled by a circuit formed by transistors $Q_{91}$ through $Q_{98}$, the test pad TP1 and the pulling-down resistor $R_3$. In this case, the transistors $Q_{91}$ and $Q_{92}$ serve as an inverter. In addition, the transistors $Q_{93}$, $Q_{94}$, and $Q_{95}$ form a NAND circuit, and the transistors $Q_{96}$, $Q_{97}$, $Q_{98}$ also form a NAND circuit. Note that the test pad TP1 and the pulling-down resistor $R_3$ are the same as those of FIG. 3.

During a normal operation mode, the test pad TP1 is in an open state, so that the charge of the test pad TP1 is discharged via the resistor $R_3$, thereby decreasing the potential at the test pad TP1. As a result, the inverter formed by the transistors $Q_{91}$ and $Q_{92}$ generates a high potential. Therefore, the NAND circuit formed by the transistors $Q_{93}$, $Q_{94}$, and $Q_{95}$ serves as an inverter for the address signal $\overline{A_0}$, and the NAND circuit formed by the transistors $Q_{96}$, $Q_{97}$, and $Q_{98}$ also serves as an inverter for the address signal $A_0$. Therefore, the circuit of FIG. 9 operates in the same way as the device of FIG. 1.

On the other hand, during a test operation mode, a high potential is applied to the test pad TP1. As a result, the inverter formed by the transistors $Q_{91}$ and $Q_{92}$ generates a low potential, and accordingly, the transistors $Q_{94}$ and $Q_{97}$ are cut off. Therefore, the gate potentials of the transistors $Q_7'$ and $Q_{10}'$ are maintained high, by the depletion-type transistors $Q_{93}$ and $Q_{96}$. Thus, in this case, the data output buses DO and $\overline{DO}$ serve as the test buses TB and $\overline{TB}$ of FIG. 3. That is, the state wherein the potentials at the data output buses DO and $\overline{DO}$ are both low exhibits an error state; i.e., one of the memory cell blocks 1-1 and 1-2 (FIG. 3) is erroneously operated.

Note that when the potentials at the data output buses DO and $\overline{DO}$ are both low, the output $D_{out}$ of the data output buffer formed by the transistors $Q_{11}$ and $Q_{12}$ reaches a high impedance state.

Figure 10:
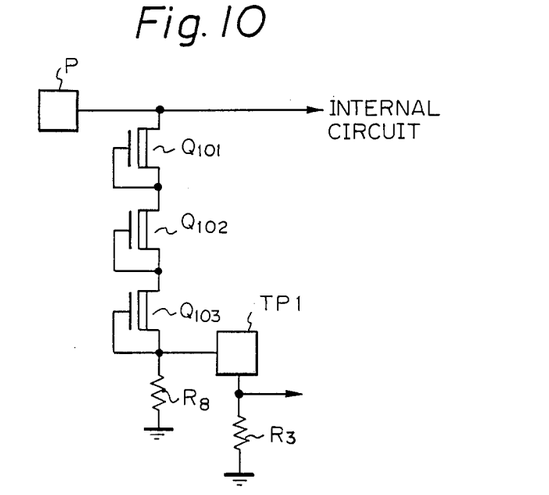
FIG. 10 is a circuit diagram of an additional circuit for the test pad of FIG. 3.

In FIG. 10, which is an additional circuit for a test pad such as TP1, the test pad TP1 is connected via depletion-type transistors $Q_{101}$, $Q_{102}$, and $Q_{103}$, and a resistor $R_8$ to a pad P for a normal operation. Such a pad P is connected to a lead pin by wire bonding or the like in the assembling process. Note that the above-mentioned test pads are usually provided inside of the memory device, and accordingly, the test pads are sealed after the completion of the memory device. Therefore, if it is required to test the memory device after the completion thereof, it is possible to do so by connecting the test pads, via inverters or the like, to the pads for use in a normal operation.

Hereinbefore, according to the present invention, since a plurality of blocks of memory cells can be tested simultaneously, a test for a large capacity memory device can be carried out in a very short time period.

What is claimed is:

1. A dynamic semiconductor memory device comprising:

a plurality of blocks of memory cells, said block being separated from each other;

a plurality of write means, respectively, operatively connected to said memory cell blocks, for writing data thereinto;

a simultaneous write enable circuit for a test mode, connected to said plurality of write means, for simultaneously performing a write operation upon said plurality of memory cell blocks via said plurality of write means;

a plurality of data output menas, respectively, operatively connected to said memory cell blocks, for storing data read out of said memory cell blocks, each of said data output means having true and complementary output signal lines;

a pair of output means, one of said output means being driven by the true output signal lines of said data output means, the other of said output means being driven by the complementary output signal lines of said data output means;

means, connected to said pair of means, for transmitting an external output signal corresponding to the logic level of said pair of output means;

a pair of output data buses connected to said pair of output means; and a data output buffer connected to said pair of output data buses, said pair of output means being connected to said output data buses for simultaneously transmitting all the read data of said data output means to said output data buses, said data output buffer being a push-pull type which reaches a high impedance state when read data of one of said pair of output means is different from read data of one of said pair of output means during a test mode.

2. A device as set forth in claim 1, further comprising:

a data input buffer for receiving an input data signal of a TTL level and for generating an input data signal of a MOS level and an inverted input data signal;

a plurality of first transfer gate means, each connected between said data input buffer and one of said write means, said plural first transfer gate means respectively, operatively connected to receive address signals, each of said first transfer gate means being activated by the corresponding one of the address signals.

3. A device as set forth in claim 2, wherein said simultaneous write enable circuit comprises;
   a plurality of second transfer gate means respectively connected in parallel to said plurality of first transfer gate means and respectively connected to said plurality of write means; and
   means, connected to said plurality of second transfer gate means, for simultaneously activating all of said plurality of second transfer gate means.

4. A device as set forth in claim 3, wherein said activating means comprises:
   a test pad operatively connected to said plurality of second transfer gate means; and
   pulling-down means connected to said test pad, wherein the potential at said test pad is applied to said plurality of second transfer gate means.

5. A device as set forth in claim 1, further comprising:
   a data input buffer for receiving an input data signal of a TTL level and for generating an input data signal of a MOS level and an inverted data signal; and
   a plurality of transfer gate means, each connected between said data input buffer and one of said write means;
   said simultaneous write enable circuit comprising:
      a test pad;
      pulling-down means connected to said test pad; and
      a plurality of NAND gate means, each having an input connected to said test pad, each having an input operatively connected to receive a respective one of a plurality of address signals, and each having an output connected to a respective one of said plurality of transfer gate means, for activating said plurality of transfer gate means.

6. A device as set forth in claim 4 or 5 further comprising a pad for use in a normal operation mode connected to each said test pad.

7. A dynamic semiconductor memory device having a test mode, comprising:
   first and second memory cell blocks which are separated from each other;
   first means for writing data into said first memory cell block;
   second means for writing data into said second memory cell block;
   a simultaneous write enable circuit, connected to said first and second means, for causing said first and second means to perform a simultaneous write operation on said first and second memory cell blocks, respectively, when said memory device is in the test mode;
   third means for storing data read out of said first memory cell block, said third means having first and second output signal lines;
   fourth means for storing data read out of said memory cell block, said forth means having first and second output signal lines;
   first output means, operatively connected to the first output signal lines of said third and forth means, for providing a first logic level signal;
   second output means, operatively connected to the second output signal lines of said third and fourth means, for providing a second logic level signal;
   means for providing an output test signal in dependence upon the first and second logic level signals when said memory device is in the test mode;
   a data input buffer for receiving an input data signal having a TTL level and for generating an input data signal and an inverted input data signal having a MOS level; and
   first and second transfer means connected to said data input buffer, respectively connected to said first and second means and operatively connected to receive address signals, for transferring the input data signal and the inverted input data signal having a MOS level to said first and second means, respectively, in dependence upon the address signals, wherein said simultaneous write enable circuit comprises:
      third and fourth transfer means, connected in parallel to said first and second transfer means, respectively; and
      means, connected to said third and fourth transfer means, for simultaneously activating said third and fourth transfer means when said memory device is in the test mode.

8. A device as set forth in claim 7, wherein said activating means comprises:
   a test pad connected to said third and fourth transfer means; and
   pull-down means connected to said test pad, wherein the potential of said test pad is applied to said third and fourth transfer means.

* * * * *

UNITED STATES PATENT AND TRADEMARK OFFICE
CERTIFICATE OF CORRECTION

PATENT NO. : 4,744,061

DATED : MAY 10, 1988

INVENTOR(S) : YOSHIHIRO TAKEMAE ET AL.

It is certified that error appears in the above-identified patent and that said Letters Patent is hereby corrected as shown below:

FRONT PAGE, Column 2, after line 9, insert the following:

--Patent Abstracts of Japan, Vol. 2, No. 150, Dec. 15, 1978 & JP-A-14-53-120-234

Col. 3, line 43, "$\overline{D}HD1$" should be --$\overline{D}_1$--.

Signed and Sealed this

Sixth Day of September, 1988

Attest:

DONALD J. QUIGG

*Attesting Officer*    *Commissioner of Patents and Trademarks*